United States Patent

Nakajima et al.

[11] Patent Number: 6,001,714
[45] Date of Patent: Dec. 14, 1999

[54] METHOD AND APPARATUS FOR MANUFACTURING POLYSILICON THIN FILM TRANSISTOR

[75] Inventors: Mitsuo Nakajima, Saitama-ken; Yasumasa Goto, Kanagawa-ken, both of Japan

[73] Assignee: Kabushiki Kaisha Toshiba, Kawasaki, Japan

[21] Appl. No.: 08/938,314

[22] Filed: Sep. 26, 1997

[30] Foreign Application Priority Data

Sep. 26, 1996 [JP] Japan .................. P8-254399

[51] Int. Cl.[6] .................. H01L 21/425
[52] U.S. Cl. .................. 438/525; 438/528; 438/510
[58] Field of Search .................. 438/528, 510, 438/514, 523, 525, 532, 533, DIG. 82, DIG. 83, DIG. 84

[56] References Cited

U.S. PATENT DOCUMENTS

| | | |
|---|---|---|
| 5,100,820 | 3/1992 | Tsbone . |
| 5,155,369 | 10/1992 | Current . |
| 5,223,445 | 6/1993 | Fuse . |
| 5,372,957 | 12/1994 | Liang et al. . |
| 5,485,019 | 1/1996 | Yamazaki et al. . |
| 5,521,107 | 5/1996 | Yamazaki et al. . |
| 5,750,435 | 5/1998 | Pan . |

FOREIGN PATENT DOCUMENTS

| | | |
|---|---|---|
| 60-127761 | 7/1985 | Japan . |
| 61-170064 | 7/1986 | Japan . |
| 5-251465 | 9/1993 | Japan . |
| 6-188264 | 7/1994 | Japan . |

*Primary Examiner*—Charles Bowers
*Assistant Examiner*—Martin Sulsky
*Attorney, Agent, or Firm*—Banner & Witcoff, Ltd.

[57] ABSTRACT

The present invention proves a method and apparatus for manufacturing a polysilicon TFT without a defective activated area in a channel region below a gate. According to the instant invention, a dopant is implanted into a polysilicon thin film formed on an substrate with a gate having a tapered edge which is used as a mask to form a source and a drain. An energy beam then slantingly irradiates from the side of the edge of the gate to the surface of the substrate. Thus, the source and drain are activated and, at the same time, the energy beam streams into the polysilicon thin film below the edge of the gate to activate the channel region implanted the dopant.

22 Claims, 9 Drawing Sheets

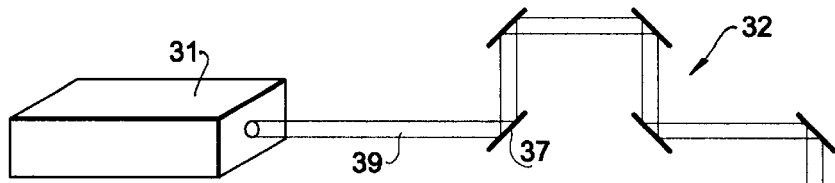
FIG. 2a
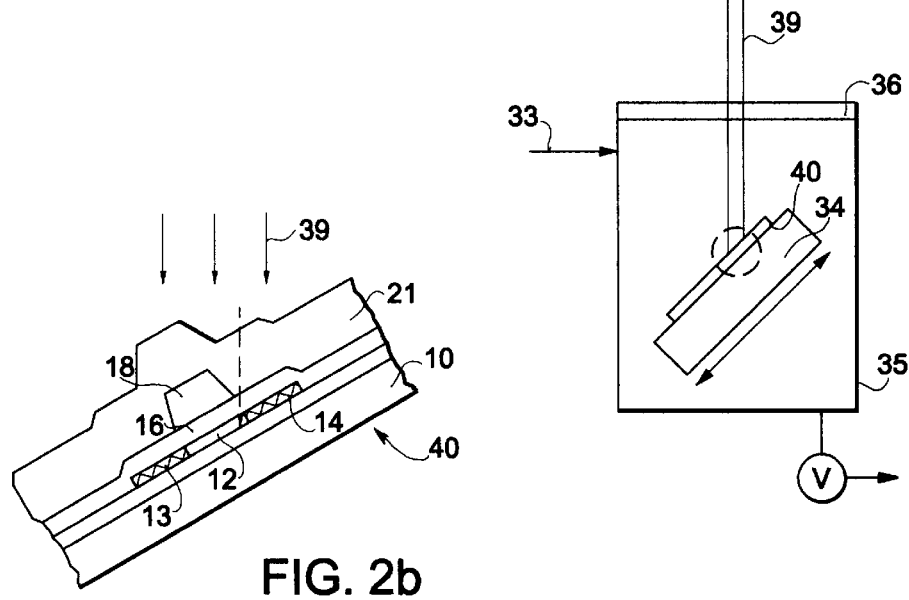
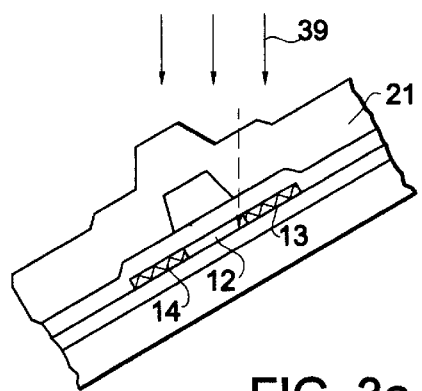
FIG. 3a
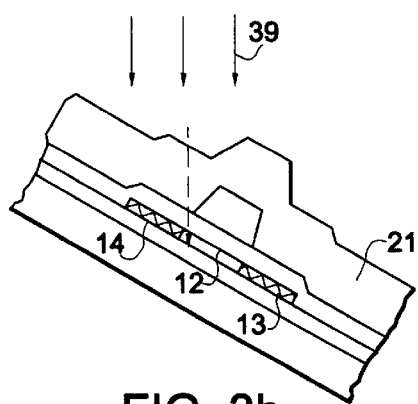
FIG. 3b
FIG. 2b

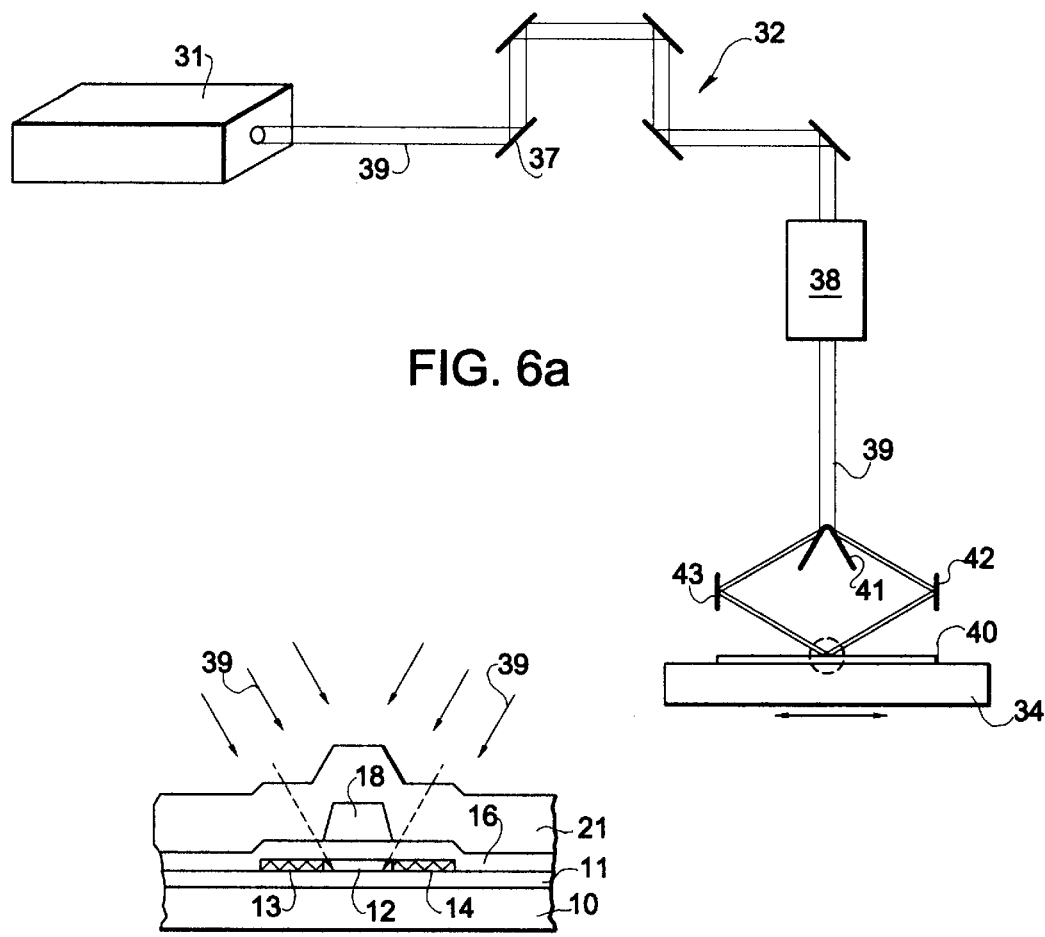
FIG. 6a
FIG. 6b
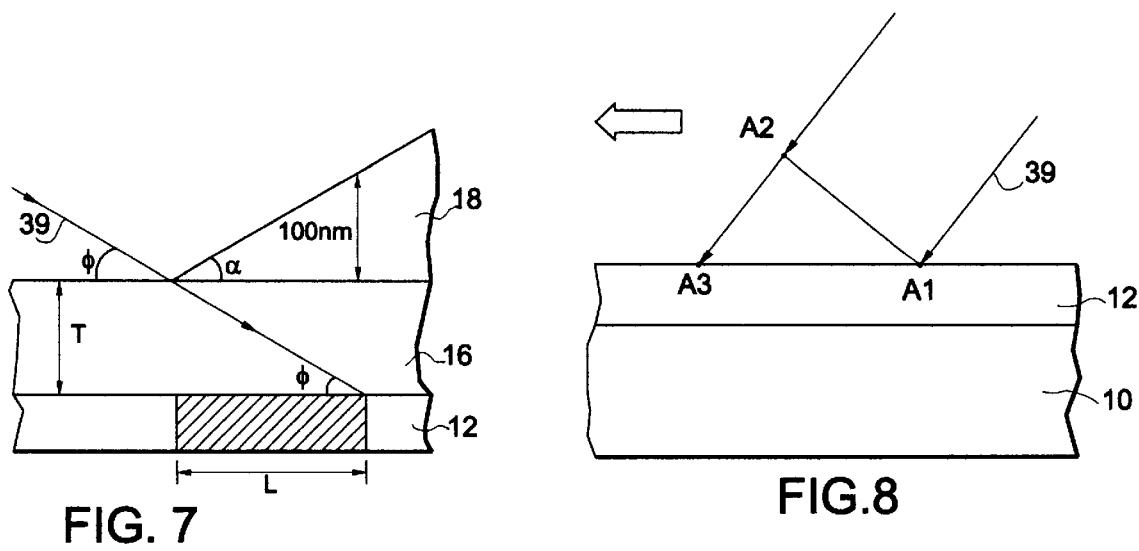
FIG. 7
FIG. 8

METHOD AND APPARATUS FOR MANUFACTURING POLYSILICON THIN FILM TRANSISTOR

FIELD OF THE INVENTION

The present invention is directed to a method for manufacturing a polysilicon (poly-Si) thin film transistor which may be used, for example, in an active matrix liquid crystal display (AM-LCD) device. In particular, the invention relates to an annealing method using an energy beam such as, for example, an excimer laser. A preferred embodiment of the present invention relates to a method for manufacturing a poly-Si thin film from an amorphous Si thin film using an energy beam for dehydrogenating the amorphous Si thin film.

BACKGROUND OF THE INVENTION

Demand for display devices using electro-luminescence, light emitting diodes, plasma, fluorescent, liquid crystal and the like, for use in office equipment, computer and other display devices and other special-purpose display devices in increasing, due, in part to the fact that they can be produced to be thin.

Among such display devices, an AM-LCD using a thin film transistor (TFT) as a switch for a pixel element for a high-quality, high-resolution, low-power consuming display is being researched and developed widely today.

A poly-Si thin film transistor (poly-Si TFT), which uses poly-Si as a TFT channel layer for the AM-LCD device, provides high definition because of its high mobility when it is used for the pixel switching element. The poly-Si may also be used in driving circuits for controlling the pixel switching element. Poly-Si TFT can be formed on a peripheral area of a substrate simultaneously with the pixels (thereby forming integrated driving circuits on the LCD). Therefore using poly-Si TFT technology can reduce the cost of mounting drive chips and the size of the peripheral area.

Currently, available LCD integrated driving circuits are used in a small or medium size displays, such as, for example, 8 inch displays, which are generally used for projection type displays and viewfinders. The manufacturing process for them is the so-called high-temperature process, which has a solid phase semiconductor layer growing process (a process at about 600° C.) or a heat oxide film growing process (a process at 900° C. or higher) for forming the poly-Si TFT. Therefore, an expensive quartz substrate or highly heat-resistant substrate must be used.

However, if a low-temperature process, such as that which has been adopted for an amorphous silicon (a-Si) TFT-LCD and which has steps at a temperature of 600 or 450° C. or below, can form a poly-Si TFT, a gate oxide film and a dopant activated area, which have the same characters as those formed by the high-temperature process, a glass substrate may be used. A plurality of LCD panels can be formed on a single substrate (yield of multiple LCD panels) by using a low cost large area glass substrate. Therefore, substantial benefits related to cost reduction and improvement of throughput can be expected.

An a-Si thin film crystallizing technology and a dopant activating technology using excimer laser annealing (ELA) are known in the low-temperature process. When the ELA is applied, the thermal damage to the substrate is decreased. Because the a-Si thin film is instantaneously melted and crystallized, a low-cost large glass substrate can be used.

FIG. 12 schematically shows a sectional view of the structure of a conventional poly-Si TFT. A channel 12 of a high resistant semiconductor layer formed of a poly-Si thin film is disposed on a transparent insulator film 11 that is disposed on a transparent substrate 10. The high resistant semiconductor layer 12 is formed by the following steps: depositing a hydrogenated amorphous silicon layer (a-Si:H layer) at a thickness of about, for example, 50 nm to about 70 nm using, for example, a conventional plasma chemical vapor deposition (CVD) method; dehydrogenating by heat annealing; and polycrystallizing by irradiating with an excimer laser. Low resistant semiconductor layers which makeup a source 13 and a drain 14 region are formed next to the high resistant semiconductor layer 12, which is the TFT channel section. The low resistant semiconductor layers 13, 14 are activated by annealing after doping impurities such as phosphorus or boron.

A gate insulator 16 is formed at a thickness of about 70 nm to about 100 nm on the channel 12. This gate insulator 16 is formed using atmosphere pressure CVD (APCVD), plasma enhanced CVD (PE-CVD) or electron cyclotron resonance PECVD (ECR-PECVD). A gate 18 is formed on the gate insulator 16. An insulator 21 is formed on the source 13, the drain 14 and the gate insulator 16. A source electrode 19 and a drain electrode 20 are connected to the low resistant semiconductor source and drain 13, 14 respectively, between the gate 18 and the source electrode 19 or the drain electrode 20. The gate 18 is required to have some thickness due to the following reasons:

a) The gate 18 works as a mask when the impurity is implanted to the source and the drain regions 13, 14 to decrease the parasitic capacitance of the device. If the gate 18 does not have an appropriate thickness, the dopant is implanted into both the gate insulator 16 and the channel 12, and the device characteristics are deteriorated. In other words, the voltage resistance of the gate is lowered, or a threshold voltage (Vth) is shifted.

b) If the same material is used, a line resistance decreases as the layer thickness increases. Therefore, the gate layer must have an appropriate thickness in view of countermeasure against the delay of the gate pulse.

The inventors of the present invention have found that the gate thickness must preferably be in the range of 250 nm to 350 nm or more if the gate electrode is made of a Mo—Ta alloy.

It has been experimentally found that a coverage failure 51 tends to result in the insulator 21 on the gate 18, as shown in FIG. 12, when the gate 18 has a thickness of about 250 nm to about 350 nm and a cross section (a side view intersecting the direction of the gate length) having a vertical wall to the substrate surface. Accordingly, it is difficult to manufacture the TFT structure without the failure 51. The coverage failure 51 causes a lower yield.

To prevent the problem of coverage failure, the gate 18 is formed to have a tapered wall as shown in FIG. 13. When the gate 18 has a tapered wall, the occurrence of coverage failure is reduced. However, forming a gate having a tapered wall includes other disadvantages as described below.

The gate 18 functions as the mask to implant the dopant to the source and the drain regions 13, 14. When the gate electrode has a tapered end face, as shown in FIG. 14, the dopant is also implanted to a part 52 in the channel 12 below the edge of the gate 18 corresponding to the taper shape.

When the glass substrate is used in the low temperature process, heat annealing at 600° C. or higher cannot be adopted because the glass substrate cannot resist the heat anneal step. Therefore, an energy beam annealing method, such as the ELA, is used in the activating step of the low temperature process. However, because the energy beam is reflected on the gate surface and does not reach the part 52 below the tapered end in which the dopant is implanted, the part 52 is left inactivated. Therefore, energy beam annealing cannot be used as an activating step in the conventional manner when the gate electrode has its end face tapered in the poly-Si TFT.

Accordingly, conventional poly-Si TFT producing processes have the following problems and corresponding disadvantages:

a) When the gate electrode is a thick layer and its end face is fabricated to be perpendicular with the substrate surface, a coverage failure is caused in the insulator, resulting in lowering the yield (FIG. 12).

b) When the gate electrode is shaped to have a tapered end face to decrease the occurrence of a coverage failure, a defective region is left in a part of a channel below the end face of the gate electrode due to insufficient activation, resulting in deteriorating the device characteristics (FIG. 13, FIG. 14).

SUMMARY OF THE INVENTION

A purpose of the present invention to provide a method for producing a poly-Si TFT without a defective activated region while avoiding or reducing coverage failures.

The present invention provides a method for manufacturing a TFT on a substrate, comprising the steps of: forming an insulator film on a substrate; forming an polysilicon film on the insulating film; forming a gate insulator on the polysilicon film; forming a gate on the gate insulator having edges that are tapered; implanting a dopant into the polysilicon film using the gate as a mask; and applying an energy beam slantingly to irradiate the implanted portion of the polysilicon film thereby activating the implanted portion of the film.

The present invention also provides a method for manufacturing TFTs on a substrate, having gates whose edges are tapered and in which longitudinal directions are the same, implanting dopant using the gates as masks, comprising the step of irradiating an energy beam slantingly to activate sources, drains and implanted parts below first side edges of the gates simultaneously.

Further, the present invention provides a method for manufacturing TFTs on a substrate, having gates whose edges are tapered having longitudinal directions that are a first direction or a second direction, implanting dopant using the gates as masks, comprising the step of: irradiating an energy beam slantingly to simultaneously activate sources, drains and a part below a first side edge of the gates which longitudinal directions are the first direction.

Furthermore, the present invention provides a method for manufacturing a TFT on a substrate, comprising the steps of: forming an polysilicon film on a substrate; forming a gate insulator on the polysilicon film; forming a gate on the gate insulator; slantingly implanting a dopant into the polysilicon film using the gate as a mask; and slantingly irradiating an energy beam to activate the implanted portion of the polysilicon film.

The present invention also provides a method for manufacturing an active matrix liquid crystal display including a TFT, comprising the steps of: forming a insulator film on a substrate; forming an polysilicon film on the insulating film; forming a gate insulator on the polysilicon film; forming a gate on the gate insulator; implanting a dopant into the polysilicon film using the gate as a mask; and activating the implanted portion of the polysilicon film by slantingly irradiating the implanted portion with an energy beam.

Additionally, the present invention provides a method for manufacturing an active matrix liquid crystal display including a TFT for switching a pixel and a TFT for driving circuits on a substrate, comprising the steps of: forming an insulator film on the substrate; forming an polysilicon film on the insulating film; forming a gate insulator on the polysilicon film; forming a gate on the gate insulator; implanting a dopant into the polysilicon film using the gate as a mask; and slantingly irradiating an energy beam to activate the implanted portion of the polysilicon film.

Further, the present invention provides a method for manufacturing an active matrix liquid crystal display including a TFT having a first longitudinal gate direction and a TFT having a second longitudinal gate direction on a substrate, comprising the steps of: forming an insulator film on the substrate; forming an polysilicon film on the insulating film; patterning the polysilicon film; forming gate insulators on the each patterned polysilicon film; forming gates on the gate insulators; implanting a dopant into the polysilicon films using the gates as masks; and slantingly irradiating an energy beam to activate the implanted portion of the polysilicon films.

The present invention provides a method for manufacturing a polysilicon layer, comprising the steps of: forming an amorphous silicon layer on a substrate; and slantingly irradiating an energy beam on the amorphous silicon layer continuously from an unfocused part of the energy beam to a focused part of the energy beam to form polysilicon from the amorphous silicon.

The present invention provides an apparatus for manufacturing a TFT using an energy beam activation comprising: a source of the energy beam; a optical system to lead the energy beam; and a stage on which a semiconductor substrate implanted dopant is placed, in a slating relationship with the energy beam.

The present invention also provides an apparatus for manufacturing a TFT using an energy beam activation comprising: a source of an energy beam; a stage on which a semiconductor substrate implanted dopant is placed; and a optical system to lead the energy beam to the substrate slantingly with respect to a horizontal plane.

Further the present invention provides an apparatus for manufacturing a polysilicon layer using an energy beam annealing comprising: a source of an energy beam; a optical system to lead the energy beam; and a stage on which a semiconductor substrate having an amorphous silicon layer deposited thereon is placed, in a slanting relationship with the energy beam.

Furthermore, the present invention provides an apparatus for manufacturing a polysilicon layer using an energy beam annealing comprising: a source of the energy beam; a stage on which a semiconductor substrate having an amorphous silicon layer deposited thereon is placed; and a optical system to lead the energy beam slantingly to the substrate.

BRIEF DESCRIPTION OF THE DRAWINGS

The invention will be described in detail herein with reference to the following drawings in which like reference numerals refer to like elements throughout the several views, and wherein:

FIG. 2 is a schematic representation of an energy beam annealing apparatus according to an embodiment of the present invention, wherein FIG. 2(a) is an exploded schematic view showing the general structure of the apparatus, and FIG. 2(b) is a schematic view showing a surface of a substrate outlined in FIG. 2(a).

FIG. 3 are diagrams illustrating an energy beam annealing method according to an embodiment of the present invention, wherein FIG. 3(a) shows a first emission of a energy beam, and FIG. 3(b) shows a second emission of a energy beam.

FIG. 4 shows diagrams of the layout of TFTs in driving circuits and a pixel field on an AM-LCD device substrate.

FIG. 5 shows diagrams of the layout of TFTs in driving circuits and a pixel field on an AM-LCD device substrate.

FIG. 6 show an energy beam annealing apparatus according to an embodiment of the present invention, wherein FIG. 6(a) is a schematic view showing the general structure of the apparatus, and FIG. 6(b) is an exploded schematic view showing a surface of the substrate outlined in FIG. 6(a).

FIG. 7 is a schematic diagram showing an incident angle of the energy beam in the neighborhood of the edge face of a gate.

FIG. 8 is a diagram illustrating an energy beam annealing method for forming a poly-Si thin film according to an embodiment of the invention.

FIG. 9 shows sectional views describing a process of manufacturing a gate offset structure according to an embodiment of the present invention, wherein

FIG. 10 shows a process of manufacturing a gate offset structure of a CMOS circuit according to an embodiment of the present invention, wherein

FIG. 15 shows diagrams illustrating a prior art process of producing a gate offset structure, wherein

DETAILED DESCRIPTION OF PREFERRED EMBODIMENTS

Figure 1A:
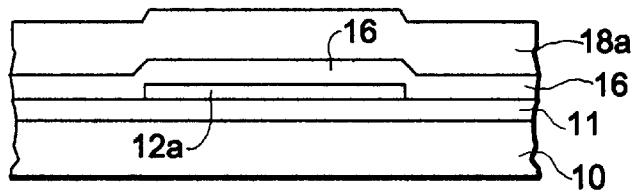
FIG. 1 is a general view of a method for manufacturing a poly-Si TFT according to an embodiment of the present invention, wherein FIG. 1(*a*) shows a metal thin layer deposited on a gate insulator, FIG. 1(*b*) shows a patterned gate, FIG. 1(*c*) shows a dopant implanted using the gate as a mask, FIG. 1(*d*) shows activating by irradiating an energy beam, and FIG. 1(*e*) shows source and drain electrodes formation.

FIG. 1 shows a view of a process for producing a poly-Si TFT according to an embodiment of the present invention. As shown in FIG. 1(a) an a-Si:H thin layer is formed at a thickness preferably in the range of about 50 to about 80 nm on a glass substrate 10 which is coated with a transparent insulator film 11 by, for example, a plasma CVD method. An a-Si thin layer is formed after the a-Si:H thin layer is dehydrogenated by thermally annealing, for example, at about 450 to about 500° C. for about 30 to about 90 minutes. The a-Si thin layer is transferred into a poly-Si thin layer by the ELA. A high resistant region 12a and other predetermined regions are patterned as shown. A low hydrogen a-Si layer may be formed without the dehydrogenating step by changing conditions of the plasma CVD, for example, by raising the substrate temperature. A poly-Si layer may be formed without using ELA, but by changing material gases for the plasma CVD to, for example, an $SiH_4$, $SiF_4$ and $H_2$ gas mixture.

A gate insulator 16 is then preferably formed, for example, at a thickness of about 100 nm on the high resistant region 12a by PECVD. A thin metal layer 18a of, for example, an Mo—Ta alloy or an Mo—W alloy, is formed at a thickness of preferably about 350 nm on the gate insulator 16.

A photo resist is patterned by using, for example, conventional photo-lithography methods. A gate 18, having a tapered end face (surface intersection with the longitudinal direction of the gate), is formed by, for example, a chemical dry etching (CDE) method using the resist as a mask, as shown in FIG. 1(b).

Figure 1B:
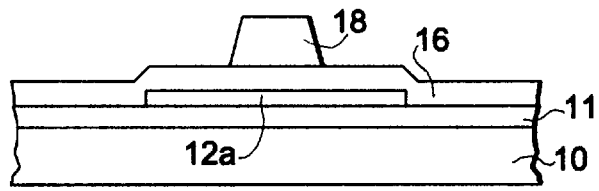
Figure 1C:
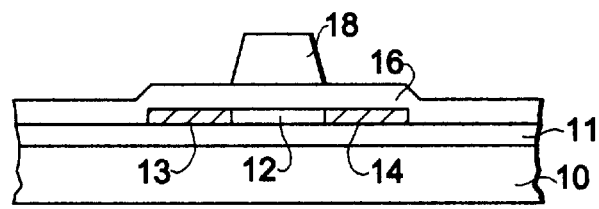

Dopant is implanted into the high resistant region 12a using the gate 18 as a mask to form low resistant semiconductor regions corresponding to a source and a drain 13, 14 as shown in FIG. 1(c).

Figure 1D:
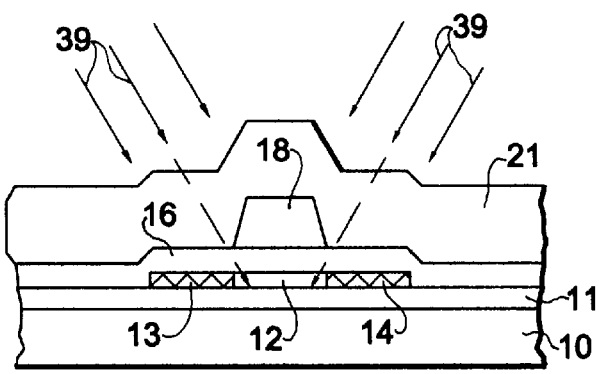

After forming the insulator layer 21, the doped source and drain 13, 14 are activated by irradiating the source and drain regions using an energy beam such as an excimer laser, as shown in FIG. 1(d). To activate the source and drain 13, 14 the energy beam 39 irradiates in a slanting direction with respect to the substrate surface, so that the energy beam 39 irradiates the dopant-implanted area below the tapered edge of the gate 18. Thus, the dopant-implanted regions are activated by the energy beam 39. The activation is carried out in the atmosphere, vacuum, or inert gases such as nitrogen, Ar or hydrogen gas.

Figure 1E:
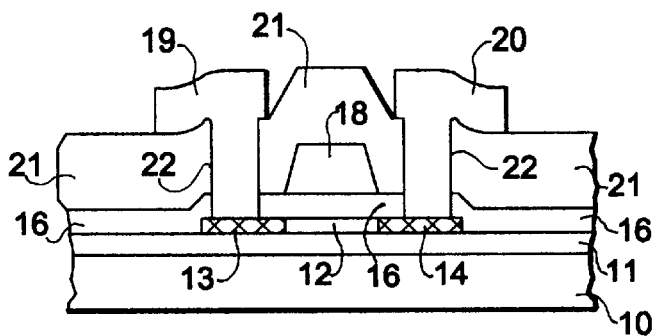

After contact holes 22 are formed, a metal layer is deposited. A source electrode 19 and a drain electrode 20 are formed by patterning the metal layer as shown in FIG. 1(e).

When the source and drain regions 13, 14 are formed by implanting the dopant into the poly-Si thin film using the gate 18 which has a tapered end face as a mask, a portion of the channel region 12 below the tapered end face of the gate 18 is also implanted with the dopant. When the source and drain regions 13, 14 are activated by the slanting energy beam 39. The slanting energy beam 39 reaches the portion below the edge of the gate 18 because the energy beam 39 irradiates in a slanting direction with respect to the substrate from the edge of the gate. Thus, having a defective portion of the activation in the channel region below the edge of the gate is avoided to a great extent.

The laser anneal process for a poly-Si TFT can be applied to an AM-LCD device integrating driver circuits, which may have peripheral driving circuits and switching circuits for controlling the pixels by poly-Si TFTs. Therefore, the low-temperature process may be applied to the formation of the display integrating driving circuits, to achieve effective cost reduction and improvement of manufacturing yield.

FIG. 2 shows an energy beam annealing apparatus, such as, for example, a laser beam annealing apparatus used, for example, the activating step of producing a poly-Si TFT according to an embodiment of the present invention. FIG. 2(a) is a schematic view showing the general structure of the apparatus and FIG. 2(b) is a schematic diagram showing a surface of a substrate outlined in FIG. 2(a). FIG. 2 denotes a energy beam source 31, an optical system 32, an energy beam 39, a vacuum chamber 35, a quartz window 36, a stage 34, and a substrate. The energy beam source 31 is located outside of the vacuum chamber 35, and the transparent quartz window 36 is provided on the ceiling of the vacuum chamber 35.

The substrate 40 is placed on the stage 34 in the vacuum chamber 35 to carry out the anneal process after the substrate 40 has undergone forming steps for a-Si thin films (12, 13, 14) as set forth above, i.e., a gate insulator 16 and a gate 18 formed on its surface; an implanting dopant step with the gate 18 as a mask; and a forming step for the insulator layer 21.

The energy beam 39 emitted from the energy beam source 31 passes through the optical system 32 where the beam is processed into a predetermined shape (e.g., a line with a narrow width, or a rectangular cross section). The beam 39 then goes through the quartz window 36, and irradiates the surface of the substrate 40. For illustrative purposes, in the following description, the energy beam is processed into a line beam having a width within approximately 1 mm.

In the energy beam annealing apparatus, the energy beam 39 is irradiated vertically from top to bottom and the stage 34 is tilted with respect to the incident direction of the energy beam 39. Thus, as shown in FIG. 2(b), the energy beam 39 irradiates the substrate 40 in a slanting direction from the edge of the gate 18. In the apparatus illustrated in FIG. 2, the optical system 32 does not move; rather the stage 34, on which the substrate 40 is placed, is oriented along a slanting direction, so that the energy beam 39 can scan the entire surface of the substrate 40. Because the slanted substrate 40 is moved in a slanted direction, the distance the beam moves in the horizontal direction is decreased, accordingly, the size of the apparatus, particularly the size of the vacuum chamber 35, is reduced.

An irradiation angle of the energy beam 39 is reversed at the source 13 side and the drain 14 side of the TFT to illuminate the energy beam 39 into the portion below the tapered edge of the gate 18 as shown in FIG. 3(a) and (b). Thus, all source and drain regions of TFTs are activated.

FIG. 7 is a cross-sectional view showing the edge face of the gate of TFT. In determining the incident angle of the energy beam with respect to the substrate, the inventors found that when the gate insulator 16 has a thickness of 100 nm and the accelerating voltage for implanting is 100 keV, the dopant can reach a portion of the poly-Si thin film below the metal gate 18 at a thickness less than 100 nm. When the edge face of the gate has an angle α to the substrate, a width L (nm) of a region of the poly-Si thin film 12 implanted the dopant below the gate is given by following equation since L is a distance from the position of the gate at a thickness 100 nm.

$$L = 100/\tan\alpha$$

On the other hand, the incident limit angle φ of the energy beam 39 to the substrate used to irradiate the implanted portion of the poly-Si thin film is determined by $$\phi = \arctan(T/L),$$

where T (nm) is a thickness of the gate insulator. Therefore, the incident angle θ of the energy beam 39 to the substrate is determined to be smaller than the limit angle φ to irradiate an inner portion:

$$\theta \geq \phi.$$

Generally, the limit angle φ depends on the dopant stopping power of the metal thin film for the gate, the thickness and a refractive index of the gate insulator, the type of the dopant and the acceleration voltage of the dopant, etc. Therefore, the incident angle θ must be determined on the basis of such parameters.

According to the method for producing the poly-Si film transistor according to an embodiment of the present invention, an energy beam such as, for example, an excimer laser by be used to activate the poly-Si layer after implantation of a dopant when a gate has a tapered edge. Therefore, an AM-LCD device can be manufactured by the low temperature process at 450° C.–600° C. Because a large glass substrate can be used and the manufacturing yield can be improved, this method is very effective to lower the production cost associated with producing an AM-LCD device.

Figure 4B:
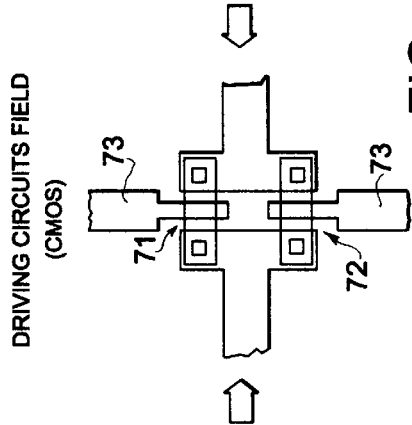
FIG. 4(a) shows a switching TFT in a pixel area and FIG. 4(b) shows a CMOS driving circuit. The longitudinal direction of the gates of the TFTs in FIGS. 4(a) and 4(b) are the same. The arrows in the figures illustrate the direction of energy beams according to an embodiment of the present invention.
Figure 5B:
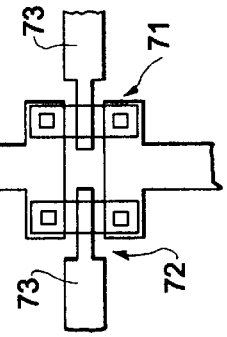
FIG. 5(a) shows a switching TFT in a pixel area and FIG. 5(b) shows a CMOS driving circuit. The longitudinal direction of the gates of the TFTs in FIGS. 5(a) and 5(b) are perpendicular to one another. The arrows in the figures illustrate the direction of an energy beams according to an embodiment of the present invention.
Figure 4A:
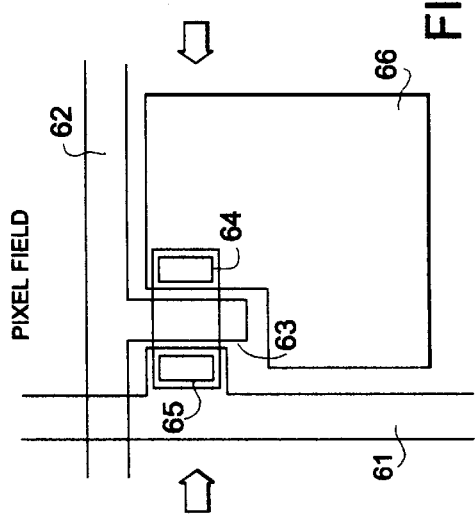
Figure 5A:
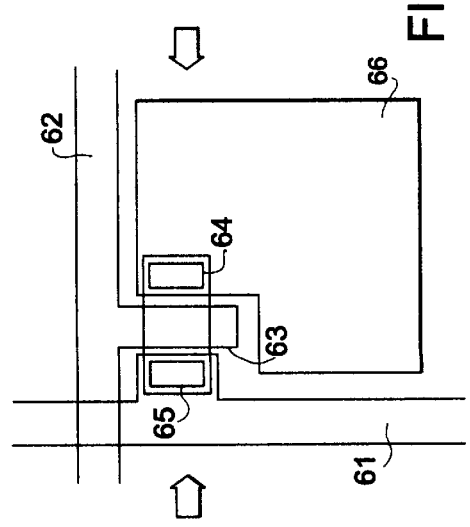
Figure 9A:
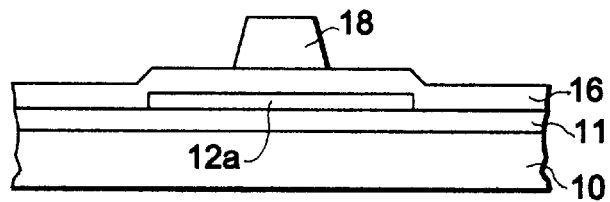
FIG. 9(a) shows a gate formed on a gate insulator.
Figure 9B:
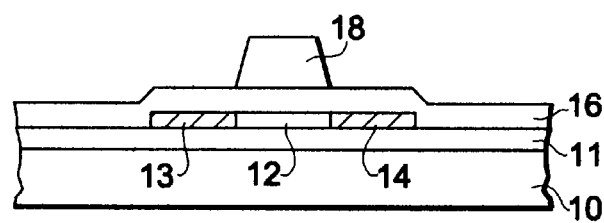
FIG. 9(b) shows a dopant implanted into a source and a drain
Figure 9C:
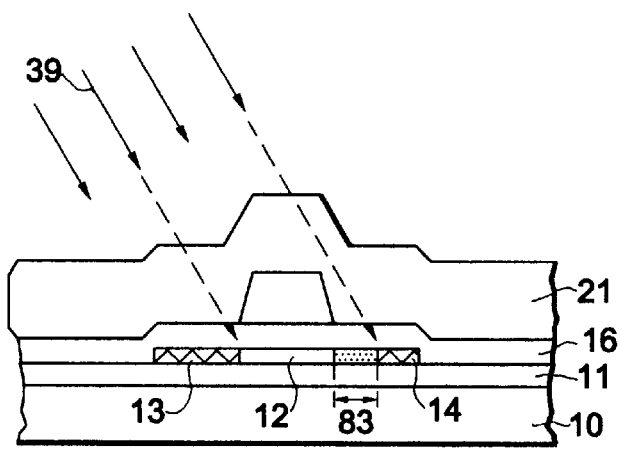
FIG. 9(c) shows an energy beam being irradiated.
Figure 9D:
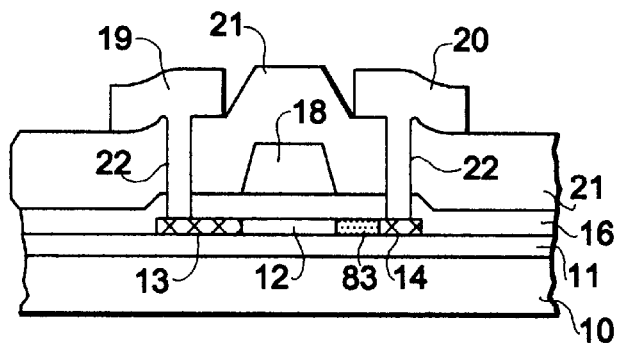
FIG. 9(d) shows formation of source and drain electrodes.

FIG. 4 and FIG. 5 illustrate another embodiment according to the present invention wherein a poly-Si TFT is applied to an AM-LCD device to integrate driving circuits on it. FIG. 4(a) and FIG. 5(a) show a switching TFT in the pixel field, and FIG. 4(b) and FIG. 5(b) show the a TFT defining a CMOS circuit in a driving circuit area.

The TFTs in FIG. 4(a) and FIG. 4(b) are formed on a substrate. The gate 63 of the switching TFT and the gates 73 of the driving TFTs 71, 72 have the same direction. Additionally, the direction of the gate 63 of the switching TFT and the direction of the gates 73 of the driving TFTs 71, 72 are perpendicular to one another although the TFTs in FIG. 5(a) and FIG. 5(b) are formed on a substrate. The arrows in FIGS. 5 and 6 illustrate the energy beam directions required to activate the region below the edges of the gates.

When TFT channels to be activated in the pixel field (FIG. 4(a)) and the driving circuits region (FIG. 4(b)) have the same direction, the regions below the tapered edge of the gate 63, 73 can be activated by sweeping the energy beam back and forth one time. The slanting energy beam irradiates the one side of the gate 63 of the switching TFT in the pixel field and the gates 73 of the CMOS TFTs in the driving circuits in one sweep. After changing the angle of the energy beam, i.e., changing the angle of the stage, the energy beam irradiates the other side of the gate 63 of the switching TFT and the gates 73 of the CMOS TFTs in one sweep back.

When the directions of TFT channels to be activated in the pixel field and in the driving circuits region are at right angles to one another, as shown in FIGS. 5(a) and (b), the regions below the tapered edge of the gate of all TFTs on the substrate cannot be activated by sweeping the energy beam back and forth only one time. It is necessary to turn the substrate 90 degrees after completing the first sweeping with the energy beam, thus the energy beam must irradiate the substrate again. The slanting energy beam irradiates the one side of the gate 63 of the switching TFT in the pixel field but not the side of the gates 73 of the CMOS TFTs in the driving circuits in one sweeping. In this case, slanting energy beams from four directions are required.

Therefore, when the method for producing a poly-Si TFT according to an embodiment of the present invention is applied to an AM-LCD device in which driving circuits are integrated, it is preferable that directions of TFT gates, namely channels, on one substrate be the same to promote efficient activation.

FIG. 6 shows another embodiment of an energy beam annealing apparatus for performing the activating step according to the present invention. FIG. 6(a) is a schematic view showing the general structure of the apparatus and FIG. 6(b) is a schematic view showing a surface of the substrate. FIG. 6(b) shows an energy beam source 31, an optical system 32, a stage 34, an energy beam 39, mirrors 41, 42 and 43, and a substrate 40.

As shown in FIG. 6, the energy beam 39 emitted from the energy beam source 31 passes through the optical system 32 and is adjusted into a predetermined shape. The beam 39 is then divided slantingly into two beams by the mirror 41 before irradiating the substrate 40. The divided energy beams are further reflected by the mirrors 42, 43 and reach the surface of the substrate 40. Accordingly, the divided energy beams 39 slantingly irradiate the surface of the substrate 40 at symmetrical angles of incidence about the normal to the surface of the substrate 40.

Therefore, both the source region and the drain region are activated simultaneously by sweeping in one direction with the energy beams using this apparatus, because the divided energy beams 39 irradiate both the source region and the drain region at the same time.

FIG. 8 is a diagram illustrating a laser annealing method according to an embodiment of the present invention. An energy beam 39, such as, for example, an excimer laser beam, slantingly irradiates an a-Si thin film 12 on a substrate 10 to transform the a-Si to poly-Si thin film.

Only a part of the slanting energy beam 39 is focused on the a-Si thin film 12 on the substrate 10, while the remaining portions are not focused on. In other words, the energy beam is focused along a line A1–A2 but not focused on a point A3 as shown in FIG. 8. When the energy beam has energy sufficient to form poly-Si thin film on a portion A1 of the a-Si thin film 12, energy irradiated to another portion A3 is lower than value required to achieve transformation value because the energy beam is not focused thereon. To change the a-Si tin film 12 to poly-Si, the a-Si thin film is irradiated by the lower energy beam (A3) first and then energy beam (A1) while the energy beam 39 sweeps from right to left as shown in FIG. 8. The lower energy beam has a dehydrogenating effect. The quality of the crystal of the poly-Si thin film formed according to the present invention, is improved because the weak energy beam irradiation dehydrogenates the a-Si thin film 12 first. The a-Si thin film 12 can then be changed to the poly-Si thin film without the preceding dehydrogenation step (pre-annealing step) by the slanting energy beam. Therefore, improved manufacturing efficiency is achieved.

The slanting energy beam according to another embodiment of the present invention can be used to form the offset gate structure of the TFT. To suppress a current flowing while the gate turns off (leak current), a lightly doped drain (LDD) structure of an offset gate structure may be applied. The LDD has low concentrations of dopant on portions between the channel and the drain. The offset gate structure has a narrower gate than the width between the activated source and drain.

FIG. 15 shows a conventional offset gate structure and a general process of producing the same. After forming a transparent insulator film 11 on a substrate 10, a high resistant region 12a of a poly-Si thin film is formed on the transparent insulator film 11, and a gate 18a is formed on a gate insulator 16 on the high resistant region 12a (FIG. 15(a)) using the process illustrated in FIGS. 1(a) and (b).

Figure 15A:
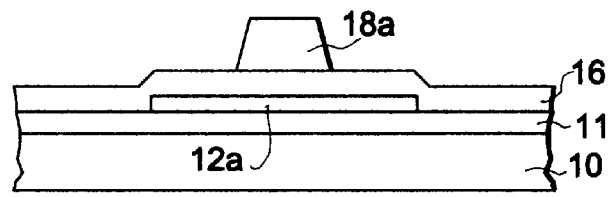
FIG. 15(a) is a sectional view of a gate electrode.
Figure 15B:
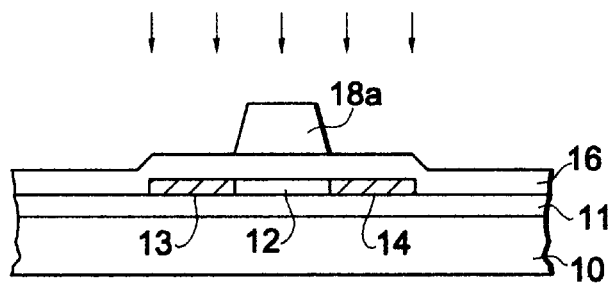
FIG. 15(b) is a sectional view of doping.
Figure 15C:
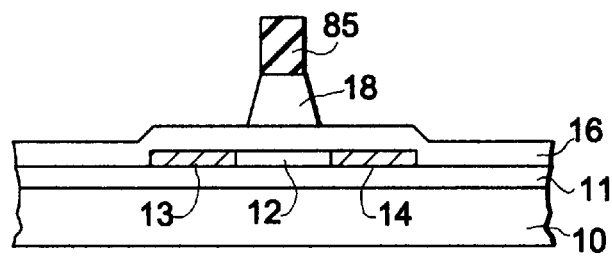
FIG. 15(c) is a sectional view of an etched gate.
Figure 15D:
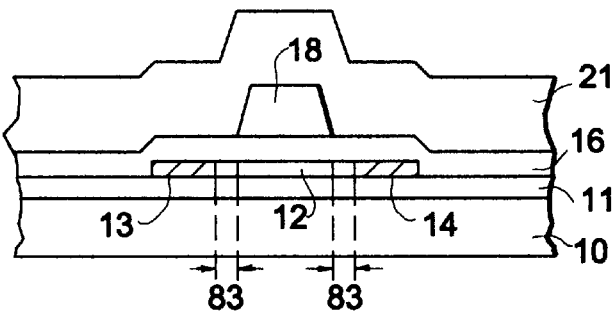
FIG. 15(d) is a sectional view of an insulator layer.

Dopant is implanted in the high resistant region 12a using the gate 18a as a mask, a channel 12, a source 13 and a drain 14 are also formed (FIG. 15(b)). Then, a resist pattern 85 narrower than the gate 18a is formed on the gate 18a, and the width of the gate is reduced by etching using resist pattern 85 as a mask (FIG. 15(c)). After removing the resist pattern 85, an insulator layer 21 is formed on the entire surface including the gate 18 (FIG. 15(d)). Accordingly, the boundaries between the channel 12 and the source 13 and between the channel 12 and the drain 14 are slightly deviated outside (83) the edge of the gate 18. The offset gate structure has the channel 12 under and slightly outside under the gate 18.

FIG. 9 shows a method for manufacturing an offset gate structure according to an embodiment of the present invention. The offset gate structure can also be formed by slantingly irradiating the energy beam from one side of the substrate.

As shown in FIG. 1(a)–(c), after forming a transparent insulator film 11 on a substrate 10, a high resistant region 12a of a poly-Si thin film is formed ion the transparent insulator film 11. A gate 18 is formed on a gate insulator 16 on the high resistant region 12a (FIG. 9(a)). Dopant is implanted in the high resistant region 12a using the gate 18 as a mask (FIG. 9(b)). An insulator layer 21 is formed on the gate 18 and the gate insulator 16, and a slanting energy beam, such as, for example, an excimer laser beam, irradiates from one direction to the substrate (FIG. 9(c)).

The portion irradiated by the energy beam is activated, so that source 13 and drain 14 are formed. There is a portion 83 that is implanted the dopant but not irradiated by the energy beam, because a shadow of the gate 18 that occurs within the drain 14. Because the portion 83 is not activated, the portion 83 has high resistance. Although there is a high resistance region 83 this structure functions equivalently to the conventional gate offset structure. Thus, an offset gate structure can be formed without using the complex conventional process (cf. FIG. 15). The width of the portion 83 (an offset length) can be controlled by an incident angle of the energy beam, and a thickness of the gate 18, the gate insulator 16 and the poly-Si thin film 12a.

After contact holes 22 are formed, a source electrode 19 and a drain electrode 20 are formed. Then, the offset gate structure TFT according to an embodiment of the present invention is obtained (FIG. 9(d)).

If the length of the offset is excessive, when the gate 18 turns on, a current between the source and the drain cannot flow sufficiently because the portion 83 has a resistance. Therefore, the offset length must be small. Thus, very accurate patterning is required in the photo lithography stage of the conventional method (cf. FIG. 15). In this embodiment, the offset length can be adjusted by varying the irradiation angle. Therefore, an accuracy equivalent to that of photo lithography can be obtained without adding a special process.

For example, when the gate insulator 16 has a thickness of 100 nm, the high resistant region 12a of the poly-Si layer has a thickness of 50 nm and the energy beam has an incident angle of 30° to the substrate, the offset length is about 0.2 μm. It is difficult to form this offset length, about 0.2 μm, by the conventional photo lithography method for LCDs. However, using the methods of the present invention will enable realization of offset lengths in the range of 0.2 μm.

Another embodiment of the present invention is directed to manufacturing a gate offset structure in CMOS circuits.

Figure 10A:
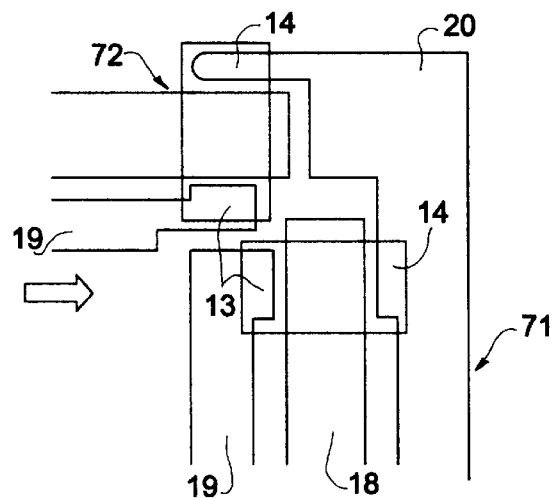
FIG. 10(a) is a plan view.
Figure 10B:
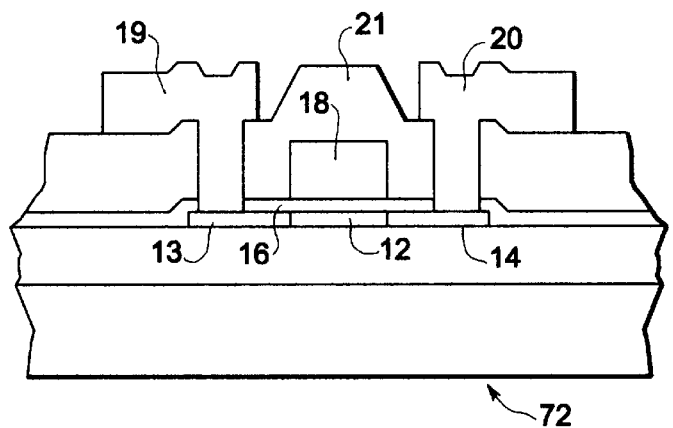
FIG. 10(b) is a sectional view taken along the channel direction of a p-channel TFT.
Figure 10C:
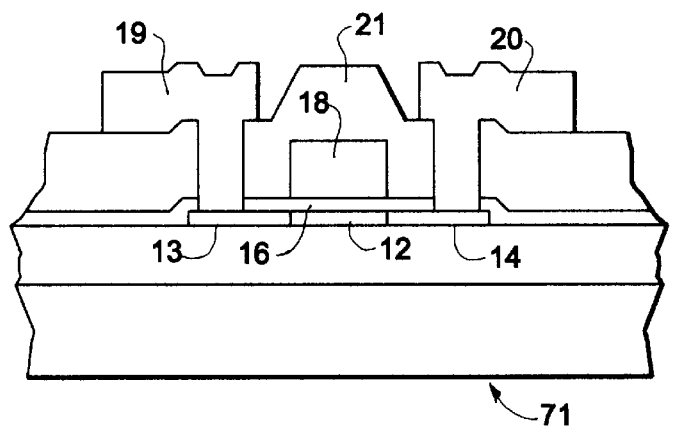
FIG. 10(c) is a sectional view taken along the channel direction of an n-channel TFT.

FIGS. 10(a)–(c) show a layout pattern of a CMOS circuit. FIG. 10(a) is a plan view, FIG. 10(b) a sectional view taken along the channel direction of a p-channel TFT, and FIG. 10(c) a sectional view taken along the channel direction of an n-channel TFT. The arrow in FIG. 10(a) shows a direction of the irradiated energy beam.

A p-channel TFT 72 and an n-channel TFT 71 have a conventional structure before being irradiated by an energy beam. The p-channel TFT 72 and the n-channel TFT 71 have channels 12, sources 13 and drains 14 on a transparent insulator film 11 on a substrate 10, and gates 18 on a gate insulator film 16 on the channels 12. The conductivity type of the channels between the p-channel TFT 72 and the n-channel TFT 71 are different, the p-channel TFT 72 has the n-type conductivity and the n-channel TFT 71 has p-type conductivity. Source electrodes 19 and drain electrodes 20 are connected to the sources 13 and drains 14 respectively, and the drain electrodes 20 both of the p-channel TFT 72 and the n-channel TFT are connected. The source electrodes 19 are connected to power sources. The gates of the p-channel TFT 72 and the n-channel TFT 71 having rectangular shapes are oriented perpendicularly to one another.

The energy beam slantingly irradiates the n-channel TFT 71 from the source 13 side, as discussed above with respect to FIGS. 9. The gate 18 creates a shadow on a part of the drain 14, so that a gate offset structure of the n-channel TFT 71 is formed. Though the energy beam irradiates the p-channel TFT 72, the gate 18 of the p-channel TFT 72 does not make a shade portion on both of the source 13 and the drain 14 of the p-channel TFT 71. Thus, the source 13 and the drain 14 of the p-channel TFT 72 are activated by the energy beam and are self-aligned.

According to this embodiment, the p-channel TFT 72 and the n-channel TFT 71 are located perpendicular, thus a TFT having a gate offset structure and a TFT having as self-aligned, activated source and drain can be formed immediately. Although the p-channel TFT 72 and the n-channel TFT 71 have a gate offset structure, this embodiment may be applied to TFTs in which gates are located perpendicularly to one another, for example, two n-channel TFTs in which gates are at a right angle to one another.

Figure 11A:
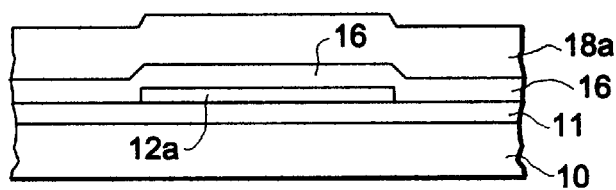
FIG. 11 is a general view of a process of producing a poly-Si TFT according to an embodiment of the present invention.

The present invention may also be applied to a method for manufacturing a poly-Si TFT. FIGS. 11 show the general view of a process of producing a poly-Si TFT. As shown in FIG. 11(a), an a-Si:H thin film is formed having a thickness, for example, in a range of about 50 to about 80 nm on a glass substrate 10 which is coated with a transparent insulator film 11 using plasma CVD. After the a-Si:H thin film is thermally annealed, for example, at about 450 to about 500° C. for about 30 to about 90 minutes for dehydrogenation, the formed a-Si thin film is annealed by an energy beam, such as an excimer laser, to transform the a-Si thin film into a poly-Si thin film. A high-resistant semiconductor film 12a is then formed by a conventional patterning.

An a-Si film having a low hydrogen content may be formed without the dehydrogenating step by changing conditions of the CVD, such that the substrate temperature is raised. Furthermore, poly-Si film may e formed without the energy beam annealing step by changing the gas of the CVD, such as, for example, a mixture gas of SiH4, SiF4 and H2.

The gate insulator 16 is formed having a thickness in the range of about 100 nm on the high-resistant semiconductor film 12a by a conventional plasma CVD.

Figure 11B:
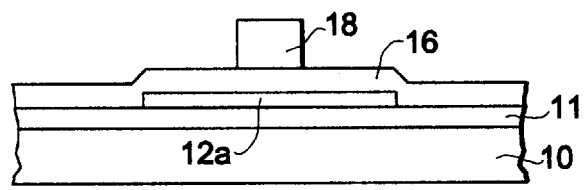

A metal thin layer 18a of an alloy, e.g., a Mo—Ta alloy or a Mo—W alloy, is formed at a thickness of about 50 nm on the gate insulator 16. A resist pattern on the metal thin layer 18a is formed on the metal thin layer 18a by conventional photo lithography methods. As shown in FIG. 11(b) a gate 18 having a the vertical edge is formed by, for example, a reactive ion etching (RIE) using the resist pattern as a mask.

Figure 11C:
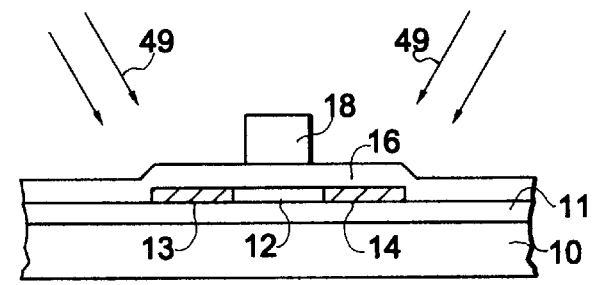

Then, dopant such as P or B is partly implanted into the high-resistant semiconductor film 12a using the gate 18 as a mask to form low resistant semiconductor regions corresponding to a source 13 and a drain 14 as shown in FIG. 11(c). At this time, the dopant 49 is implanted slantingly from right or left. The amount of dopant to be implanted into the source 13 and drain 14 is, for example, about $1\times10^{15}$ to $1\times10^{16}/cm^2$. The dopant 49 may be implanted slantingly, or may be implanted by orienting and holding the substrate in a slanted position.

Figure 11D:
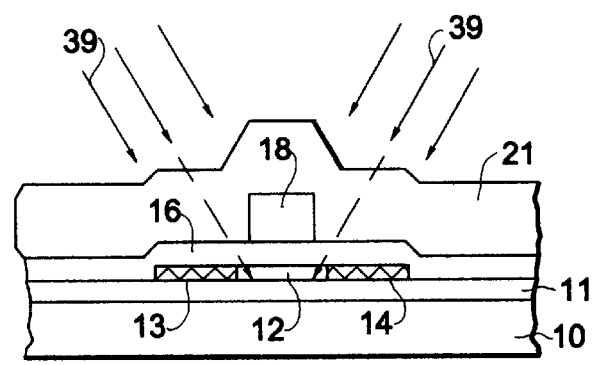

After forming an insulator layer 21, the energy beam is irradiated to activate the source 13 and the drain 14, as shown in FIG. 11(d). The energy beam 39 slantingly irradiates the dopant implanted portion below the edge of the gate 18 to activate it. When the excimer laser beam is used as the energy beam 39, the power of the laser is, for example, about 180 to 240 $mJ/cm^2$. The activation is carried out in the atmosphere, a vacuum, inert gas such as nitrogen or Argon or hydrogen gas.

An implantation angle of the dopant (an angle with respect to the substrate) in larger than the irradiation angle of the energy beam 39 (an angle with respect to the substrate) to avoid leaving a portion that is implanted the dopant but which is not activated due to failure of the energy beam 39 to reach the area.

Figure 11E:
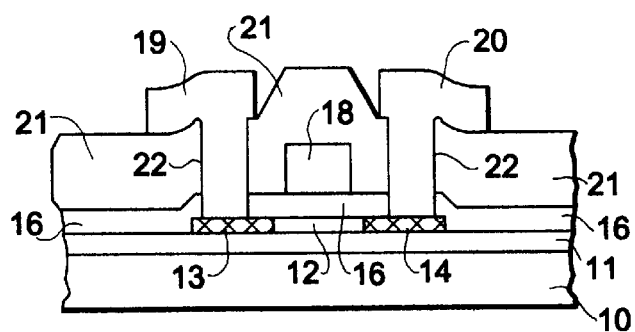
Figure 12:
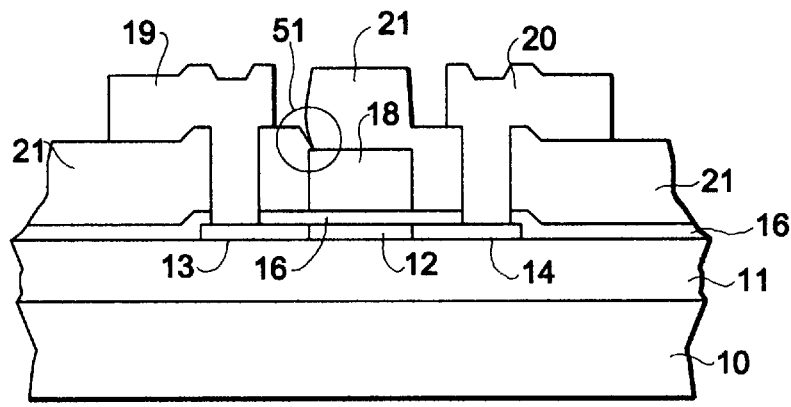
FIG. 12 is a sectional view of a conventional TFT structure.
Figure 13:
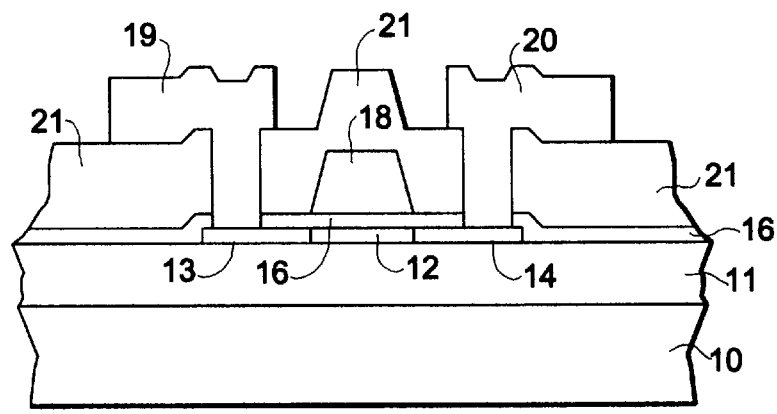
FIG. 13 is a sectional view of another conventional TFT structure.
Figure 14:
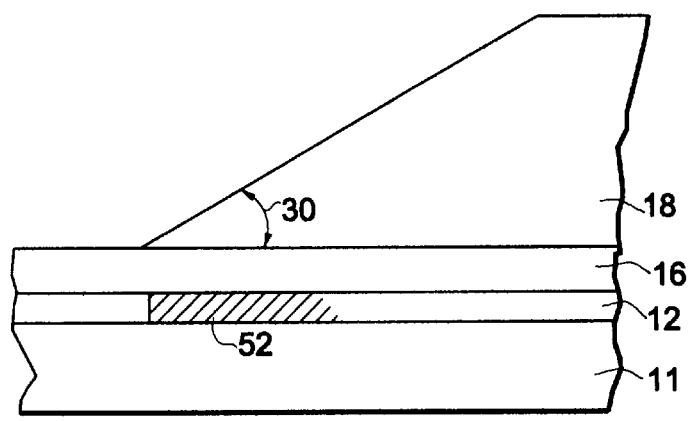
FIG. 14 is a detail of the sectional view of a conventional TFT structure.

After forming the contact holes 22, the metal layer is deposited. This metal layer is patterned to form the source electrode 19 and the drain electrode 20 as shown in FIG. 11(e).

A poly-Si TFT having a narrower channel than the gate width and having no defective activation can be produced by the method according to this embodiment of the present invention.

It is to be noted that the present invention is not limited to the above embodiments. For example, the a-Si:H thin film can be formed by a LPCVD instead of the plasma CVD method. To omit the dehydrogenating step for the a-Si:H thin film, an a-Si thin film having a low hydrogen content may be formed. The thickness of the a-Si:H thin film is, for example, preferably in the range of about 50 nm–80 nm. A poly-Si film may be formed directly by a deposition method such as, for example, a CVD. The gate insulator may be formed by, for example, an APCVD or an ECR-PECVD instead of the PECVD. The thickness of the gate insulator is, for example, preferably in the range of about 70 nm–100 nm.

An exemplary material for the gate may be Mo, Al, Ta, W, Cu, an alloy thereof, a multilayered thin film thereof, or a doped silicon thin film. The thickness of the gate is, for example, preferably in the range of about 250 nm–400 nm. Further, a TFT structure is not limited to the co-planer type as illustrate din the above embodiments. The present invention may also be applied to an LDD structure or a multigate (double or more gates) TFT, having a plurality of gate electrodes. Additionally, the energy beam annealing may be carried out before forming the insulator layer on the gate.

An energy beam having excellent characteristics of absorption in semiconductor layers and straightness is, for example, an excimer laser of XeCl, XeF, or KrF.

The driving circuits of a LCD device may consist of CMOS TFTs. When the driving circuits consist of CMOSs, the LCD device does not consume a large power.

The energy beam annealing apparatus is not limited to the above-described embodiments. For example, the state 34 on which a substrate 40 is placed may have a heater built therein to heat the substrate. The substrate 40 may also be annealed by the energy beam in a vacuum or a particular atmosphere. The atmosphere can be determined depending the desired result. For example, in order to prevent carbon from contaminating the thin films, the atmosphere is preferably a nitrogen atmosphere, or a hydrogen atmosphere is preferable where deoxidizing. In addition to a method in which the substrate is moved, a method moving the optical system may be used to irradiate an energy beam to the entire surface of the substrate.

While the invention has been described in conjunction with specific embodiments thereof, it is evident that many alternatives, modifications and variations will be apparent to those skilled in art. Accordingly, the preferred embodiments of the invention, as set forth herein, are intended to be illustrative, not limiting. Various changes may be made without departing from the true spirit and full scope of the invention as defined in the following claims.

What is claimed is:

1. A method for manufacturing a TFT on a substrate, comprising the steps of:

forming a polysilicon film on a substrate;

forming a gate insulator on said polysilicon film;

forming a gate on said gate insulator, said gate having edges that are tapered;

implanting a dopant into said polysilicon film using said gate as a mask; and irradiating said implanted portion of said polysilicon film with a slanting energy beam to activate substantially all of said implanted portion and to form a source and a drain under both sides of said gate, wherein said implanted portion involves areas below both side edges of said gate.

2. A method for manufacturing a TFT on a substrate according to claim 1, further comprising the steps of:

forming an insulator layer on said gate and said gate insulator;

forming contact holes in said insulator layer on said source and said drain; and forming electrodes in said contact holes, connected to said source and said drain.

3. A method for manufacturing a TFT on a substrate according to claim 1, wherein the substrate is tilted such that the energy beam slantingly irradiates the implanted portion.

4. A method for manufacturing a TFT on a substrate according to claim 1, wherein the energy beam is slanted by mirrors.

5. A method for manufacturing a TFT on a substrate according to claim 1, wherein an incident angle θ of the energy beam with respect to the substrate is defined by:

$$\theta \leq \arctan(T/L),$$

where T is a thickness of the gate insulator and L is a width of the implanted portion below the gate.

6. A method for manufacturing a TFT on a substrate according to claim 1, wherein the energy beam is a laser beam.

7. A method for manufacturing a TFT on a substrate according to claim 6, wherein the laser beam is an excimer laser beam of XeCl or XeF or KrF.

8. A method for manufacturing TFTs on a substrate, said TFTs having longitudinal direction gates with first and second tapered edges along said longitudinal direction, wherein longitudinal direction of the first and second edges are the same, and dopant is implanted into a film using the gates as masks, comprising the step of:

irradiating dopant implanted portions of said film with a slanting energy beam from the side of said first tapered edges to activate sources, drains and implanted portions of said film below said first tapered edges of said gates; and irradiating dopant implanted portions of said film with a slanting energy beam from the side of said second tapered edges to activate sources and drains and implanted portions of said film below said second tapered edges of said gates.

9. A method for manufacturing TFTs on a substrate according to claim 8, wherein at least one TFT is a switch for a pixel and another TFT is included in a driving circuit.

10. A method for manufacturing TFTs on a substrate according to claim 9, wherein said energy beam is a laser beam.

11. A method for manufacturing TFTs on a substrate according to claim 9, wherein said irradiating steps are carried out at the same time.

12. A method for manufacturing TFTs on a substrate, a first TFT of said TFTs having a first longitudinal direction gate with a first and a second tapered edge, a second TFT of said TFTs having a second longitudinal direction gate perpendicular to said first longitudinal direction gate with a first and second tapered edge and dopant is implanted in a film using the gates as masks, comprising the step of:

irradiating said dopant implanted portions of said film with a slanting energy beam from both sides of said first longitudinal direction gates to activate sources and drains of said first and second TFTs, and to activate said implanted portions of said film below both edges of said first longitudinal direction gate.

13. A method for manufacturing TFTs on a substrate according to claim 12, wherein a TFT in which the gate has a first direction and a TFT in which the gate has a second direction form a CMOS.

14. A method for manufacturing TFTs on a substrate according to claim 12, wherein the energy beam is a laser beam.

15. A method for manufacturing a TFT on a substrate, comprising the steps of:

forming an polysilicon film on a substrate;

forming a gate insulator on said polysilicon film;

forming a gate on said gate insulator;

implanting a dopant slantingly into said polysilicon film using said gate as a mask; and irradiating said implanted portion of said polysilicon film using a slanting energy beam, wherein said implanted portion involves areas below two sides of said gate and substantially all of said implanted position is activated to form a source and a drain under both sides of said gate.

16. A method for manufacturing a TFT on a substrate according to claim 15, wherein a implanting angle with respect to the substrate is greater than an irradiating angle with respect to the substrate.

17. A method for manufacturing a TFT on a substrate according to claim 15, wherein the substrate is inclined in the implanting step and the irradiating step.

18. A method for manufacturing a TFT on a substrate according to claim 15, wherein the energy beam is a laser beam.

19. A method for manufacturing an active matrix liquid crystal display including a TFT, comprising the steps of:

forming an polysilicon film on a substrate;

forming a gate insulator on said polysilicon film;

forming a gate on said gate insulator, said gate having edges that are tapered;

implanting a dopant into said polysilicon film using said gate as a mask; and irradiating the implanted portion of the polysilicon film with a slanting energy beam to activate said implanted portion, and to form a source and a drain under said tapered edges of said gate.

20. A method for manufacturing an active matrix liquid crystal display including a first TFT having a first longitudinal direction gate and a second TFT having a second longitudinal direction gate on a substrate, comprising the steps of:

forming an insulator film on said substrate;

forming an polysilicon film on said insulator film;

patterning said polysilicon film;

forming gate insulators on said patterned polysilicon film;

forming said first longitudinal direction gate and said second longitudinal direction gate perpendicular to a first longitudinal direction on said gate insulators;

implanting a dopant into said polysilicon films using said gates as masks; and irradiating the implanted portion of the polysilicon films with a slanting energy beam from both sides of said first longitudinal direction gate to activate sources and drains of said first and second TFTs, and to activate said implanted portions of said polysilicon film below both sides of said first longitudinal direction gate.

21. A method for manufacturing a TFT on a substrate according to claim 1, wherein said irradiating step includes a sub-step of irradiating a slanting energy beam from one side of said gate and a sub-step of irradiating a slanting energy beam from the other side of said gate.

22. A method for manufacturing a TFT on a substrate according to claim 1, wherein slanting energy beams from both sides of said gate irradiate said implanted portion at the same time in said irradiating step.

* * * * *